US012685086B2

(12) United States Patent
Oowada et al.

(10) Patent No.: US 12,685,086 B2
(45) Date of Patent: Jul. 14, 2026

(54) TEMPORARY ADHESION METHOD, DEVICE WAFER PROCESSING METHOD, LAMINATE FOR TEMPORARY ADHESION, AND LAMINATE FOR DEVICE WAFER PROCESSING

(71) Applicant: SHIN-ETSU CHEMICAL CO., LTD., Tokyo (JP)

(72) Inventors: Tamotsu Oowada, Yokohama (JP); Shohei Tagami, Annaka (JP); Mitsuo Muto, Takasaki (JP); Masahito Tanabe, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 370 days.

(21) Appl. No.: 17/928,641

(22) PCT Filed: Apr. 26, 2021

(86) PCT No.: PCT/JP2021/016677
§ 371 (c)(1),
(2) Date: Nov. 30, 2022

(87) PCT Pub. No.: WO2021/251018
PCT Pub. Date: Dec. 16, 2021

(65) Prior Publication Data
US 2023/0178412 A1     Jun. 8, 2023

(30) Foreign Application Priority Data

Jun. 12, 2020    (JP) ................................. 2020-102386

(51) Int. Cl.
*H10P 72/70*      (2026.01)
*C09J 179/08*     (2006.01)
*C09J 183/04*     (2006.01)

(52) U.S. Cl.
CPC ........ *H10P 72/7402* (2026.01); *C09J 179/08* (2013.01); *C09J 183/04* (2013.01);
(Continued)

(58) Field of Classification Search
CPC ....... H01L 21/6836; H01L 2221/68327; H01L 21/6835; H01L 23/544; H01L 21/78; H01L 21/568; H01L 23/3121
See application file for complete search history.

(56) References Cited

U.S. PATENT DOCUMENTS 7,541,264 B2    6/2009   Gardner et al.
9,566,722 B2    2/2017   Sitti et al.
(Continued)

FOREIGN PATENT DOCUMENTS

CN        106457811 A     2/2017
CN        106459680 A     2/2017
(Continued)

OTHER PUBLICATIONS

Dec. 26, 2023 Notification of Reasons for Refusal issued in Japanese Patent Application No. 2022-530055.
(Continued)

*Primary Examiner* — Brian Turner
(74) *Attorney, Agent, or Firm* — Oliff PLC

(57)          ABSTRACT

A temporary adhesion method for temporarily adhering a wafer to a support via a temporary adhesive layer, the wafer having a first main surface including a circuit and a second main surface to be processed, the second main surface being located on an opposite side to the first main surface, wherein a temporary adhesion between the first main surface of the wafer and the support is performed via the temporary adhesive layer including a dry adhesive fiber structure having a plurality of pillar structures.

7 Claims, 3 Drawing Sheets

(52) U.S. Cl.
CPC ..... *C09J 2203/326* (2013.01); *H10P 72/7412* (2026.01); *H10P 72/7416* (2026.01); *H10P 72/744* (2026.01)

(56) References Cited

U.S. PATENT DOCUMENTS

| | | | |
|---|---|---|---|
| 2005/0233547 A1 | 10/2005 | Noda et al. | |
| 2005/0271869 A1 | 12/2005 | Jackson | |
| 2010/0136281 A1 | 6/2010 | Sitti et al. | |
| 2010/0252177 A1* | 10/2010 | Sargent | C09J 7/00 |
| | | | 428/156 |
| 2011/0039095 A1 | 2/2011 | Maeno et al. | |
| 2012/0288680 A1 | 11/2012 | Nguyen et al. | |
| 2015/0072110 A1 | 3/2015 | Sitti et al. | |
| 2015/0368519 A1* | 12/2015 | Sitti | C09J 7/00 |
| | | | 428/399 |
| 2016/0240523 A1* | 8/2016 | Takamoto | H01L 24/27 |
| 2016/0326403 A1* | 11/2016 | Yoneyama | B32B 27/26 |
| 2017/0072669 A1 | 3/2017 | Sekido et al. | |
| 2018/0320264 A1 | 11/2018 | Lau | |
| 2018/0337083 A1* | 11/2018 | Inada | H01L 21/6835 |
| 2018/0339497 A1 | 11/2018 | Makino et al. | |
| 2019/0040283 A1 | 2/2019 | Straumann | |
| 2019/0088524 A1* | 3/2019 | Lee | H01L 21/78 |
| 2020/0181457 A1* | 6/2020 | Kamada | B32B 27/08 |
| 2020/0205300 A1* | 6/2020 | Wu | H01L 21/4857 |
| 2021/0071046 A1 | 3/2021 | Arzt et al. | |
| 2021/0261405 A1 | 8/2021 | Dai et al. | |

FOREIGN PATENT DOCUMENTS

| | | |
|---|---|---|
| CN | 108292590 A | 7/2018 |
| CN | 209210688 U | 8/2019 |
| CN | 110482481 A | 11/2019 |
| JP | 2004-022997 A | 1/2004 |
| JP | 2004-64040 A | 2/2004 |
| JP | 2006-328104 A | 12/2006 |
| JP | 2007-231187 A | 9/2007 |
| JP | 2016-197679 A | 11/2016 |
| JP | 2019-504497 A | 2/2019 |
| JP | 3220830 U | 4/2019 |
| JP | 2020-061529 A | 4/2020 |
| KR | 10-2010-0121702 A | 11/2010 |
| TW | I565780 B | 1/2017 |
| WO | 2008/076391 A2 | 6/2008 |
| WO | 2009/128342 A1 | 10/2009 |
| WO | 2019129540 A1 | 7/2019 |

OTHER PUBLICATIONS

Murphy et al., Enhanced Adhesion by Gecko-Inspired Hierarchical Fibrillar Adhesives, Applied Materials and Interfaces, 2009, pp. 849-855, vol. 1, No. 4.

Sitti et al., Synthetic gecko foot-hair micro/nano-structures as dry adhesives, Journal of Adhesion Science and Technology, 2003, pp. 1055-1073, vol. 17, No. 8.

Jul. 27, 2021 International Search Report Issued in International Patent Application No. PCT/JP2021/016677.

Dec. 13, 2022 International Preliminary Report on Patentability Issued in International Patent Application No. PCT/JP2021/016677.

Aug. 8, 2023 Notification of Reasons for Refusal issued in Japanese Patent Application No. 2022-530055.

Khaled et al., "Fabrication and Characterization of Thermoplastic Elastomer Dry Adhesives with High Strength and Low Contamination," Applied Materials & Interfaces, May 14, 2014, vol. 6, No. 9, pp. 6806-6815.

Yu et al., "Preparation and Properties of Polyurethane/Silicone Materials for Biomimetic Gecko Setae," Proceedings of SPIE, IEEE, Mar. 9, 2014, vol. 9058, pp. 90581A-1-90581A-8.

May 14, 2024 Extended Search Report issued in European Patent Application No. 21823042.3.

Jul. 29, 2024 Office Action issued in Taiwanese Patent Application No. 110114848.

Dec. 17, 2024 Office Action issued in Japanese Patent Application No. 2024-024452.

Nov. 21, 2024 Office Action issued in Taiwanese Patent Application No. 113140290.

Jul. 11, 2025 Office Action issued in Chinese Patent Application No. 202180041297.4.

Mar. 18, 2025 Office Action issued in European Patent Application No. 21823042.3.

May 9, 2025 Office Action issued in Korean Patent Application No. 10-2022-7042376.

Feb. 6, 2026 Office Action issued in Chinese Patent Application No. 202180041297.4.

Feb. 26, 2026 Office Action issued in Taiwanese Patent Application No. 113140290.

Jan. 23, 2026 Office Action issued in Korean Patent Application No. 2022-7042376.

Jul. 24, 2025 Office Action issued in Taiwanese Patent Application No. 113140290.

Nov. 19, 2025 Office Action issued in Chinese Patent Application No. 202180041297.4.

* cited by examiner

[FIG. 1]
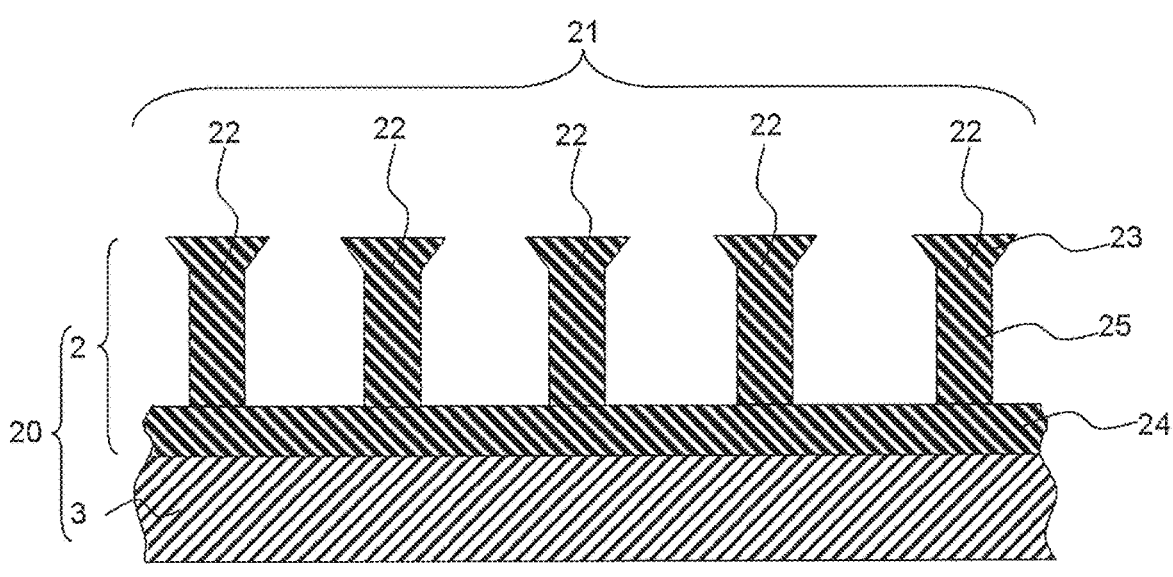
[FIG. 2]
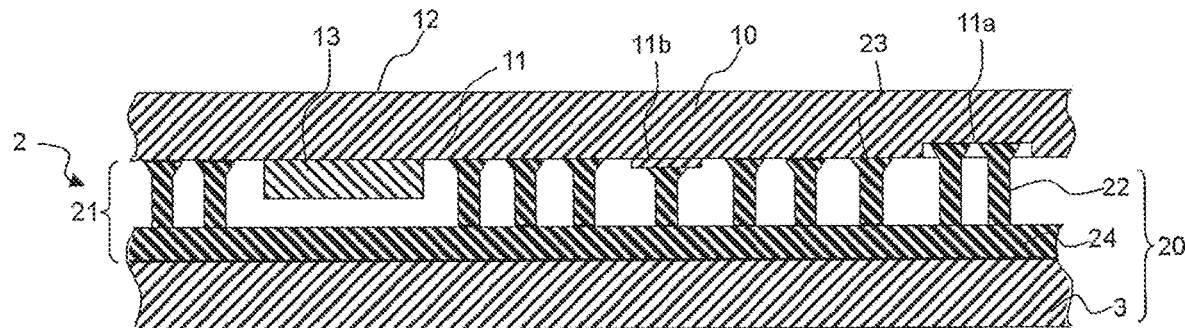

[FIG. 3]
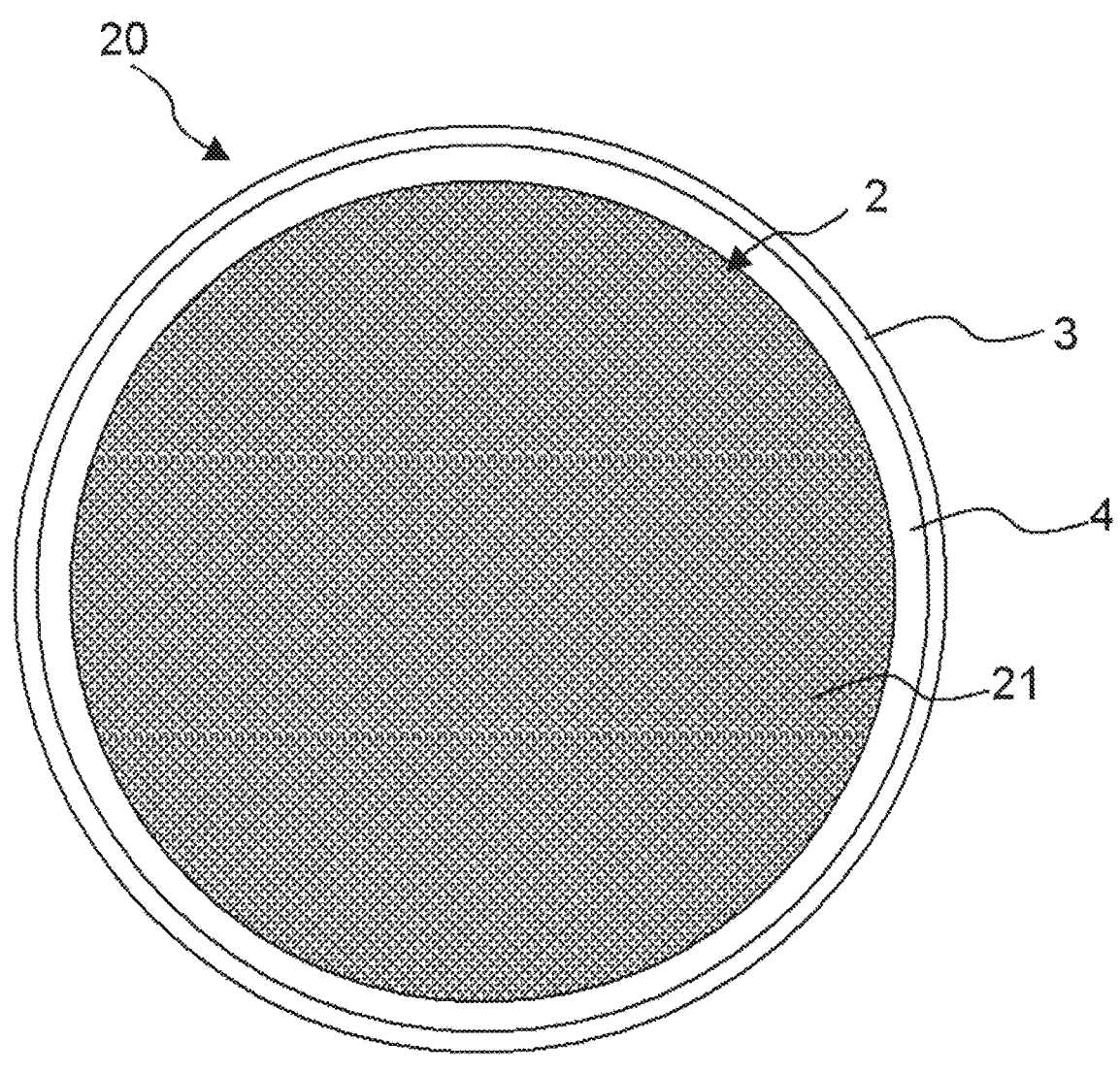

[FIG. 4]
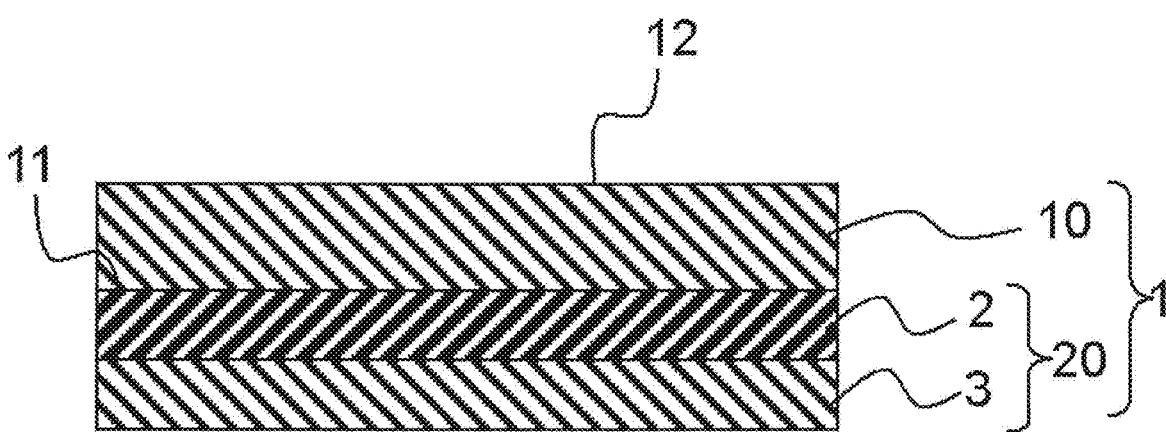

TEMPORARY ADHESION METHOD, DEVICE WAFER PROCESSING METHOD, LAMINATE FOR TEMPORARY ADHESION, AND LAMINATE FOR DEVICE WAFER PROCESSING

TECHNICAL FIELD

The present invention relates to a temporary adhesion method, a device wafer processing method, a laminate for temporary adhesion, and a laminate for device wafer processing.

BACKGROUND ART

Three-dimensional semiconductor packaging have been essential to achieve further higher density and capacity. The three-dimensional packaging technology is a semiconductor production technology in which one semiconductor chip is thinned, and subsequently connected with through silicon via (TSV), etc. and laminated into multilayer. To achieve this technology, there is required a process of thinning a wafer in which a semiconductor circuit is formed by grinding a surface (also referred to as "back surface") on which a circuit is not formed, and a process of subsequently forming an electrode including a TSV on the back surface. Conventionally, in the process of grinding the back surface of the silicon substrate, a protecting tape is attached to a side opposite to the surface to be grinded to prevent wafer breaking during the grinding. This tape uses an organic resin film as a support substrate and has flexibility, but on the other hand has insufficient strength and heat resistance. Thus, this tape is not suitable for the TSV forming process nor a wiring layer forming process on the back surface.

Hence, proposed is a system in which a support such as silicon and glass is bonded to the semiconductor wafer via an adhesive layer for sufficient resistance against the processes of back-surface grinding and TSV or back-surface electrode forming. An important point in this time is the adhesive layer when the wafer is bonded to the support. This adhesive layer requires: ability to strongly bond the wafer to the support; sufficient durability for resistance against the following processes; and easy removability of the thin wafer from the support finally. Accordingly, since removed finally, this adhesive layer is referred to as a temporary adhesive layer herein.

Conventionally proposed as a known temporary adhesive layer and its removing method are: a technology in which highly intensive light is irradiated with an adhesive material containing a light-absorbing substance for decomposing the adhesive layer to remove the adhesive material layer from the support (Patent Document 1); and a technology in which a heat-melting hydrocarbon-based compound is used as an adhesive material to perform bonding and removal in a heat-melted state (Patent Document 2). The former technology, which depends ablation of the laser-absorbing layer caused by the intensive light from a laser oscillator to easily remove the thin wafer from the support, applies almost no stress to the thin wafer during the removal. The latter technology, which heats the substrate to pyrolyze the adhesive material, is an extremely excellent temporary adhesion technology when a process temperature of TSV formation and wiring formation, performed after attaching the support, is within a range not causing pyrolysis of the adhesive material (approximately 200° C. or lower).

In addition, a technology in which a silicone sticking agent is used for a temporary adhesive material layer is proposed (Patent Document 3). In this technology, a wafer is bonded to a support by using an addition-curable silicone sticking agent, and during removal, the wafer is immersed in a reagent that dissolves or decomposes the silicone resin to remove the wafer from the support.

CITATION LIST

Patent Literature

Patent Document 1: JP 2004-64040 A
Patent Document 2: JP 2006-328104 A
Patent Document 3: U.S. Pat. No. 7,541,264 B
Patent Document 4: US 2015/0368519 A
Patent Document 5: U.S. Pat. No. 9,566,722 B

Non Patent Literature

Non Patent Document 1: APPLIED MATERIAL & INTERFACES, Vol. 1, No. 4, pp. 849-855, 2009
Non Patent Document 2: J. Adhesion Sci. Technol., Vol. 17, No. 8, pp. 1055-1073

SUMMARY OF INVENTION

Technical Problem

A material used in the existing technology of temporary adhesion of course basically has a function of attaching (adhering) a wafer to be thinned and a support, and rather has a characteristic function of separating the thinned wafer and the support after the process. The reference Patent Documents utilize the laser ablation, pyrolysis, and dissolution effect into a solvent. However, when the temporary adhesive layers in the technologies described in these Patent Documents are used for the attachment once and then removed, the function of attachment is not exhibited again. Thus, the material that has been the temporary adhesive layer is typically eliminated by washing after the removal. Therefore, a renewed attachment requires forming a renewed temporary adhesive layer. In other words, the temporary adhesive layer in the conventional temporary adhesive technology cannot be used repeatedly.

Furthermore, such a special apparatus performing the laser ablation in Patent Document 1 is extremely expensive.

The present invention has been made in view of the above problem. An object of the present invention is to provide: a temporary adhesion method that can achieve sufficiently strong temporary adhesion between a wafer and a support, that can achieve easy removal of the wafer from the support, and that can repeatedly achieve the temporary adhesion and the removal; a device wafer processing method in which the wafer and the support are temporarily adhered by this temporary adhesion method to process the wafer; a laminate for temporary adhesion that can achieve the temporary adhesion between the wafer and the support with sufficiently strength, that can achieve the easy removal of the wafer from the support, and that can repeatedly achieve the temporary adhesion and the removal; and a laminate for device wafer, processing comprising this laminate for temporary adhesion.

Solution to Problem

To achieve the above object, the present invention provides a temporary adhesion method for temporarily adhering a wafer to a support via a temporary adhesive layer, the wafer having a first main surface comprising a circuit and a second main surface to be processed, the second main surface being located on an opposite side to the first main surface, wherein a temporary adhesion between the first main surface of the wafer and the support is performed via the temporary adhesive layer comprising a dry adhesive fiber structure having a plurality of pillar structures.

The inventive temporary adhesion method performs the temporary adhesion via the temporary adhesive layer including the dry adhesive fiber structure having the plurality of the pillar structures, and thereby the inventive method can prevent; separation of the wafer from the support during processes, such as thinning process, electrode forming, metal wiring forming, and protective film forming. In addition, after the processes, the wafer can be easily removed from the support without an expensive machine, etc. The dry adhesive fiber structure having the plurality of the pillar structures can be reused for another temporary adhesion after releasing the temporary adhesion between the wafer and the support. In other words, the inventive temporary adhesion method can achieve the sufficiently strong temporary adhesion between the wafer and the support, the easy removal of the wafer from the support, and the repeated temporary adhesion and removal. Therefore, the inventive temporary adhesion method can produce, for example, thin device wafers with high productivity and low cost.

A structure in which the plurality of the pillar structures formed with a thermosetting resin is preferably used as the dry adhesive fiber structure.

The dry adhesive fiber structure in which the plurality of the pillar structures is formed with a thermosetting resin can exhibit excellent resistance against a vacuum process and a heat process. Thus, using such a dry adhesive fiber structure can further improve the productivity and cost performance of thin device wafers.

A structure in which the plurality of the pillar structures is formed with a silicone-modified polyimide is preferably used as the dry adhesive fiber structure.

In such a dry adhesive fiber structure, the plurality of the pillar structures can exhibit excellent heat resistance and excellent flexibility. Thus, using such a dry adhesive fiber structure can further improve the productivity of thin device wafers.

The present invention also provides a device wafer processing method, wherein a temporary adhesion between the first main surface of the wafer and the support is performed by the inventive temporary adhesion method; and the second main surface of the wafer temporarily-adhered is processed.

In the inventive device wafer processing method, a temporary adhesion between the wafer and the support is performed according to the inventive temporary adhesion method, and the second main surface of the wafer temporarily adheres by such a method is processed. Thus, thin device wafers can be produced with high productivity and low cost.

The temporary adhesion with the temporary adhesive layer can be released after processing the second main surface of the wafer, and subsequently the temporary adhesive layer can be reused for another temporary adhesion.

The temporary adhesive layer comprising the dry adhesive fiber structure used in the inventive temporary adhesion method and the inventive device wafer processing method can be repeatedly used for the temporary adhesion and the removal.

The temporary adhesion with the temporary adhesive layer can be released after processing the second main surface of the wafer, and subsequently a substrate other than the wafer can be temporarily adhered to the support via temporary adhesion.

In the inventive device wafer processing method, after one wafer is processed, a substrate other than this wafer can be temporarily adhered to the support by repeatedly using the temporary adhesive layer.

The present invention provides a laminate for temporary adhesion used for temporarily adhering a wafer to a support via a temporary adhesive layer, the laminate comprising: the support; and the temporary adhesive layer formed on the support, wherein the temporary adhesive layer comprises a dry adhesive fiber structure having a plurality of pillar structures.

In the inventive laminate for temporary adhesion, the temporary adhesive layer includes the dry adhesive fiber structure having the plurality of the pillar structures. Thus, the inventive laminate can prevent separation of the wafer from the support during processes, such as thinning process, electrode forming, metal wiring forming, and protective film forming. In addition, after the processes, the wafer can be easily removed from the support without an expensive machine, etc. The dry adhesive fiber structure including the plurality of the pillar structures can be reused for another temporary adhesion after releasing the temporary adhesion between the wafer and the support. In other words, using the inventive laminate for temporary adhesion can achieve sufficiently strong temporary adhesion between the wafer and the support, the easy removal of the wafer from the support, and the repeated temporary adhesion and removal. Therefore, using the inventive laminate for temporary adhesion can produce, for example, thin device wafers with high productivity and low cost.

The plurality of the pillar structures is preferably formed with a thermosetting resin.

The pillar structures formed with a thermosetting resin can exhibit excellent resistance against a vacuum process and a heat process. Thus, using the laminate for temporary adhesion having such pillar structures can further improve the productivity and cost performance of thin device wafers.

Examples of the plurality of the pillar structures include a silicone resin, a polyimide resin, an epoxy resin, an acrylic resin, a polyester, a polyamide resin, a phenol resin, a fluororesin, a polyurethane, a polycarbonate, polystyrene, and rubbers such as SBR and NBR. To exhibit the heat resistance and the flexibility, the pillar structures are preferably formed with a silicone-modified polyimide.

Such pillar structures can exhibit excellent heat resistance and excellent flexibility. Thus, using the laminate for temporary adhesion having such pillar structures can further improve the productivity of thin device wafers.

The laminate for temporary adhesion preferably further comprising a guard ring formed on the support and surrounding the dry adhesive fiber structure.

The dry adhesive fiber structure including such a guard ring can prevent penetration of a liquid for processing onto the first main surface side of the wafer even when, for example, the second main surface of the wafer is subjected to a wet process.

The present invention also provides a laminate for device wafer processing, comprising: the inventive laminate for temporary adhesion; and a wafer having a first main surface having a circuit and a second main surface to be processed, the second main surface being located on an opposite side to the first main surface, and the first main surface temporarily-adhered to the support via the temporary adhesive layer on the support.

In the inventive laminate for device wafer processing, the temporary adhesive layer includes the dry adhesive fiber structure having the plurality of the pillar structures. Thus, the inventive laminate can prevent separation of the wafer from the support during processes of the second main surface of the wafer. In addition, after the process, the wafer can be easily removed from the support without an expensive apparatus. Furthermore, after the process, the temporary adhesive layer can be reused for another temporary adhesion. Therefore, using the inventive laminate for device wafer processing can produce, for example, thin device wafers with high productivity and low cost.

Advantageous Effects of Invention

As described above, the inventive temporary adhesion method can achieve the sufficiently strong temporary adhesion between the wafer and the support, the easy removal of the wafer from the support, and the repeated temporary adhesion and removal. Therefore, according to the inventive temporary adhesion method, thin device wafers can be produced with high productivity and low cost.

The inventive device wafer processing method can produce thin device wafers with high productivity and low cost.

The inventive laminate for temporary adhesion can achieve the sufficiently strong temporary adhesion between the wafer and the support, the easy removal of the wafer from the support, and the repeated temporary adhesion and removal. Therefore, the inventive laminate for temporary adhesion can produce thin device wafers with high productivity and low cost.

The inventive laminate for device wafer processing can produce thin device wafers with high productivity. Its utility value is remarkably high.

BRIEF DESCRIPTION OF DRAWINGS

FIG. 1 is a schematic partial sectional view illustrating an example of the inventive laminate for temporary adhesion.

FIG. 2 is a schematic partial sectional view illustrating an example in which the inventive laminate for temporary adhesion is temporarily adhered to a wafer.

FIG. 3 is schematic plane view illustrating another example of the inventive laminate for temporary adhesion.

FIG. 4 is a schematic plane view illustrating an example of the inventive laminate for device wafer processing.

DESCRIPTION OF EMBODIMENTS

As described above, there have been demands for the developments of a temporary adhesion method that can achieve sufficiently strong temporary adhesion between a wafer and a support, easy removal of the wafer from the support, and repeated temporary adhesion and the removal.

The present inventors have earnestly studied the above problem, and consequently found that by temporarily adhering a first main surface to a support via a dry adhesive fiber structure having a plurality of pillar structures, the first main surface being located on an opposite side to a second main surface to be processed of a wafer, the sufficiently strong temporary adhesion between the wafer and the support, the easy removal of the wafer from the support, and repeated temporary adhesion and removal can be achieved. The present inventors have completed the present invention based on these findings.

Specifically, the present invention is a temporary adhesion method for temporarily adhering a wafer to a support via a temporary adhesive layer, the wafer having a first main surface comprising a circuit and a second main surface to be processed, the second main surface being located on an opposite side to the first main surface, wherein a temporary adhesion between the first main surface of the wafer and the support is performed via the temporary adhesive layer comprising a dry adhesive fiber structure having a plurality of pillar structures.

In addition, the present invention is a device wafer processing method, wherein a temporary adhesion between the first main surface of the wafer and the support is performed by the above inventive temporary adhesion method; and the second main surface of the wafer temporarily-adhered is processed.

Furthermore, the present invention is a laminate for temporary adhesion used for temporarily adhering a wafer to a support via a temporary adhesive layer, the laminate comprising: the support; and the temporary adhesive layer formed on the support, wherein the temporary adhesive layer comprises a dry adhesive fiber structure having a plurality of pillar structures.

Furthermore, the present invention is a laminate for device wafer processing, comprising: the above inventive laminate for temporary adhesion; and a wafer having a first main surface having a circuit and a second main surface to be processed, the second main surface being located on an opposite side to the first main surface, and the first main surface temporarily adhered to the support via the temporary adhesive layer on the support.

Should be noted that, for example, Patent Document 4 and Non Patent Document 1 disclose a dry adhesive fiber structure. In addition, for example, Patent Document 5 and Non Patent Document 2 disclose a method for producing a dry adhesive fiber structure. These documents, however, are silent on an application of the dry adhesive fiber structure to temporary adhesion in the device wafer production process.

Hereinafter, the present invention will be described in detail, but the present invention is not limited thereto.

Laminate for Temporary Adhesion

The inventive laminate for temporary adhesion is a laminate for temporary adhesion used for temporarily adhering a wafer to a support via a temporary adhesive layer, the laminate including: a support; and the temporary adhesive layer formed on the support, wherein the temporary adhesive layer has a dry adhesive fiber structure having a plurality of pillar structures.

The temporary adhesive layer including the dry adhesive fiber structure having the plurality of the pillar structure can perform a temporary adhesion between the wafer and the support on contact of the tips of the pillar structures with a surface of the wafer. Although not wishing to be bound by any theory, it is presumed that contacting the tips of the pillar structures with the wafer surface generates an intermolecular force between the tips of the plurality of the pillar structures and the wafer surface, and this intermolecular force achieves the temporary adhesion.

Such temporary adhesion can provide sufficiently strong temporary adhesion between the wafer and the support for prevention of separation of the wafer from the support during wafer processes, such as, for example, thinning process, electrode forming, metal wiring forming, and protective film forming.

Meanwhile, this temporary adhesion allows the wafer to be easily removed from the support after the process without an expensive apparatus. Examples of specific removing methods include: a method in which one of the wafer or the support is horizontally fixed and the other is lifted with a certain angle to the horizontal direction; a method in which a protective film is attached to a ground surface of a ground wafer, and the wafer and the protective film are removed from the processed body including the wafer by a peeling method; and a method in which a part of the wafer is lifted and removed with tweezers. Any of these removing methods can be applied to the present invention. The method is of course not limited to the above.

The temporary adhesive layer including the dry adhesive fiber structure having the plurality of the pillar structures can be reused for another temporary adhesion after releasing the temporary adhesion once. This is presumably because the temporary adhesion with the dry adhesive fiber structure utilizes the intermolecular force, and even after the once removal, contacting the tips of the plurality at the pillar structures with a temporary adhesion target regenerates the intermolecular force again to achieve another temporary adhesion.

In addition, the temporary adhesive layer of the inventive laminate for temporary adhesion can achieve strong adhesion even when the temporary adhesion target does not necessarily have a flat surface. The first main surface to which the temporary adhesive layer temporarily adheres, which includes a circuit, is typically not flat. The temporary adhesive layer of the inventive laminate for temporary adhesion can strongly adheres to even the first main surface including the circuit.

Since being temporary adhesion based on the intermolecular force, the temporary adhesion with the temporary adhesive layer of the inventive laminate for temporary adhesion does not, require an additional heat-curing treatment such an in use of an adhesive.

Since being temporary adhesion based on the intermolecular force, the temporary adhesion with the temporary adhesive layer of the inventive laminate for temporary adhesion does not necessarily require washing with repeated use. That is, the present invention can eliminate the necessity of washing, which is required in a conventional method, and can provide the temporary adhesion process that can reduce time and washing cost of the semiconductor apparatus production.

As described above, using the inventive laminate for temporary adhesion can achieve the sufficiently strong temporary adhesion between the wafer and the support, the easy removal of the wafer from the support, and the repeated temporary adhesion and removal. Therefore, using the inventive laminate for temporary adhesion can produce, for example, thin device wafers with high productivity and low cost.

Next, the inventive laminate for temporary adhesion will be more specifically described with reference to FIGS. 1 to 3.

FIG. 1 is a schematic partial sectional view illustrating an example of the inventive laminate for temporary adhesion.

A laminate 20 for temporary adhesion illustrated in FIG. 1 includes a support 3 and a temporary adhesive layer 2 formed on the support 3. The temporary adhesive layer 2 includes a dry adhesive fiber structure 21 having a plurality of fine pillar structures 22.

A material of the support 3 is not particularly limited, and silicon, glass, and quartz can be used, for example. That is, substrates such as, for example, a silicon wafer, a glass plate, and a quartz wafer can be used as the support 3 without any limitation. In the present invention, no radiant energy ray, etc. is necessarily irradiated with the temporary adhesive layer 2 through the support 3, and thereby the support 3 may have no light transparency.

The pillar structures 22 can be, for example, fine, flexible fibers. Each of the plurality of the pillar structures 22 has a tip 23 directed opposite to the support 3. The tips 23 of the pillar structures 22 illustrated in FIG. 1 have a wide shape in which the width is enlarged toward the end directed upward.

The fine fiber is, for example, one obtained by subjecting a resin material to elongation process into a thin and tubular shape. As an elongation method, injection molding, extrusion molding, etc. can be used. Other methods for obtaining the fine fiber include a method in which a cylindrical mold is formed on a Si substrate by dry-etching, and a resin material is poured into the formed cylindrical mold to form a cylindrical resin, that is the fine fiber.

The method for forming the fine fiber is not limited to the above methods.

A material of the fine fiber is preferably a resin material, but in addition, the material may be composed of any carbon fiber, glass fiber, or other composite materials exhibiting heat resistance, chemical resistance, flexibility, etc., but the material is not limited.

The pillar structure 22 can be formed with, for example, a resin Examples of preferable resins include an epoxy resin, an acrylic resin, a silicone resin, a polyester, a polyimide resin, a polyamide resin, a phenol resin, a fluororesin, a polyurethane, a polycarbonate, polystyrene, and rubbers such as SBR and NBR.

In particular, the pillar structure 22 is preferably formed with a thermosetting resin. The pillar structure 22 formed with a thermosetting resin has high process applicability to processes such as TSV formation and a wiring forming process on wafer back surface, specifically, has excellent process resistivity against vacuum processes such as chemical vapor deposition (CVD) and wafer heating process. Such a pillar structure 22 can further improve the productivity of the thin device wafers.

For example, the pillar structure 22 formed with a silicone-modified polyimide can exhibit flexibility, and in addition, can exhibit heat resistance against approximately 300° C. or higher owing to its polyimide skeleton in the material.

Meanwhile, when the wafer and the support are attached each other with an adhesive in Patent Document 2, which is pyrolyzed at approximately 200° C., the adhesion has no resistance against a process temperature equal to or higher than the pyrolysis temperature in TSV formation and rewiring process.

The plurality of the pillar structures 22 may be directly formed on the support 3, or may be supported on a base 24 as illustrated in FIG. 1, for example. That is, in the laminate 20 for temporary adhesion according to the embodiment illustrated in FIG. 1, the dry adhesive fiber structure 2 includes the base 24 formed on the support 3 and the plurality of the pillar structures 22 supported on the base 24. The base 24 may be formed with a material same as or different from the material of the plurality of the pillar structures 22.

The plurality of the pillar structures 22 is preferably arranged regularly on a surface of the support 3 as, for example, illustrated in FIG. 1. In addition, forming the plurality of the pillar structures 22 on the support substrate 3 with a certain pitch as, for example, illustrated in FIG. 2, can achieve further stable temporary adhesion. The pitch as illustrated in FIG. 2 enables to intentionally avoid an electrode structure (circuit) 13 provided on a first main surface 11 side of a wafer 10, which is a temporary adhesion target (a wafer to be a device wafer). In other words, the plurality of the pillar structures 22 may be arranged so as to have a reverse pattern to a device pattern formed on the first main surface 11 of the wafer 10.

The plurality of the pillar structures 22 is preferably disposed regularly and densely on the support 3. Such arrangement can achieve further stable temporary adhesion. The plurality of the pillar structures 22 is preferably formed at a density of $100/mm^2$ or more and $5000/mm^2$ or less, and preferably $250/mm^2$ or more and $1500/mm^2$ or less.

Furthermore, the plurality of the pillar structures 22 can be contacted with the surface of the first main surface 11 of the wafer 10 so as to follow the surface geometry of this first main surface. Thus, even when the first main surface 11 of the wafer 10 has a recess part 11a and a protrusion part 11b, that is even when the wafer 10 is a highly stepped substrate, the plurality of the pillar structures 22 can achieve stable temporary adhesion to the first main surface 11 of the wafer 10.

Each shape of the plurality of the pillar structures 22 may be any without particular limitation as long as it is a pillar. For example, the shape may be any of cylindrical and prismatic shapes. As illustrated in FIG. 1, the tip 23 of the pillar structure 22 preferably has a wide shape (spatula shape) because of further improvement of the adsorption strength. A ratio of cross sectional areas of the tip 23 and main part 25 of the pillar structure 22 is preferably 1:1 to 1:2. That is, when the tip 23 contacted with the wafer is specified as an upper part, the pillar structure preferably has the upper part wider than the lower part. The tip 23 of the pillar structure 22 may have a structure like a sucker.

Each of the pillar structure 22 may have a height of, for example, 1 μm to 1 mm, and is preferably a pillar structure having a height of 10 μm to 500 μm. Each of the pillar structure 22 may have a bottom surface having a diameter of, for example, 10 nm to 100 μm, and preferably has a bottom surface having a diameter of 1000 nm to 20 μm. Meanwhile, the tip 23 of each pillar structure 22 may have a diameter of, for example, 20 nm to 200 μm.

The inventive laminate 20 for temporary adhesion can control the temporary adhesive force to the wafer, which is the temporary adhesion target. Specifically, the temporary adhesive force between the support substrate 3 and the wafer can be regulated with, for example, a diameter size of the tip 23 of the pillar structure 22, a number of the pillar structures 22 per unit area, and a diameter of the main part 25 of the pillar structure 22.

After the temporary adhesion between the support substrate 3 and the wafer is achieved, shear stress is applied in handling in a processing machine and in a CMP process in processes of forming TSV and rewiring. Thus, a temporary adhesion force against this stress is required between the support substrate 3 and the wafer. Meanwhile, the support substrate 3 is to be finally removed, and thereby applying excessive temporary adhesive force should be avoided. The inventive laminate 20 for temporary adhesion can control the temporary adhesive force to the wafer 10 to be temporarily adhered, and therefore can exhibit the temporary adhesive force that is sufficient for resisting the process stress and that is regulated so as to enable to be easily removed finally.

A 180° peel-removing strength on the temporary adhesive layer 2 to, for example, a polyimide tape specimen with 25 mm in width is preferably 2 gf or more and 50 gf or less. This is because the laminate 20 for temporary adhesion having such a peel-removing strength has no risk of occurrence of a wafer gap during wafer grinding, and achieves the easy removal, for example.

Preferably, the laminate 20 for temporary adhesion further includes a guard ring 4 formed on the support 3 and surrounding the dry adhesive fiber structure 21, as illustrated in FIG. 3, for example.

In the attached surfaces of the wafer and the support 3 which are temporarily adhered to each other via the temporary adhesive layer 2, a gap is generated since the temporary adhesive layer is the dry adhesive fiber structure. The wafer is often subjected to wet processes, such as removing a resist, etching a metal, and washing the device wafer, and immersion of a liquid into the above gap may be a problem. Disposing the guard ring 4 on the support 3 can prevent the immersion of the process liquid into the gap.

A plane shape of the support 3 is not particularly limited. The support 8 may have a plane shape similar to the temporary adhesive layer 2, or may be a plane shape larger than the temporary adhesive layer 2. When a circular guard ring 4 is provided, the pane shape of the support 3 may be a plane shape similar to an outer peripheral shape of the guard ring 4 surrounding the dry adhesive fiber structure 21 of the temporary adhesive layer 2, or may be a plane shape larger than the outer peripheral shape of the guard ring 4, as illustrated in FIG. 3.

Although the above exemplified laminate 20 for temporary adhesion has, for example, a circular shape with 200 mm or 300 mm in diameter, the laminate 20 for temporary adhesion may have a panel shape of square or rectangle.

A ratio of an area where the pillar structures 22 are formed to an area of the support 3 is preferably 0.02% to 50%, and more preferably 1% to 25%.

Laminate for Device Wafer Processing

The inventive laminate for device wafer processing includes: the inventive laminate for temporary adhesion; and a wafer having a first main surface having a circuit and a second main surface to be processed, the second main surface being located on an opposite side to the first main surface, and the first main surface temporarily adhered to the support via the temporary adhesive layer on the support.

The inventive laminate for device wafer processing includes the inventive laminate for temporary adhesion described above. Thus, by the temporary adhesion with the temporary adhesive layer including the dry adhesive fiber structure having the plurality of the pillar structures, the inventive laminate for device wafer processing can prevent separation of the wafer from the support during processes of the second main surface of the wafer. In addition, after the process, the wafer can be easily removed from the support without an expensive apparatus. Furthermore, after the process, the temporary adhesive layer can be repeatedly used for another temporary adhesion, as described above. Therefore, using the inventive laminate for device wafer processing can produce, for example, thin device wafers with high productivity and low cost.

Next, the inventive laminate for device wafer processing will be specifically described with reference to FIG. 4.

A laminate 1 for device wafer processing illustrated in FIG. 4 comprises a laminate 20 for temporary adhesion and a wafer 10.

The laminate 20 for temporary adhesion comprises the support 3 and the temporary adhesive layer 2 formed on the support 3, which have been described with reference to FIGS. 1 and 2. The temporary adhesive layer 2 includes the dry adhesive fiber structure 21 having the plurality of the pillar structures 22 illustrated in FIG. 1.

The wafer 10 has the structure illustrated in FIG. 2. That is, the wafer 10 has: a first main surface 11 including a circuit 13; and a second main surface 12 to be processed, the second main surface 12 being located on an opposite side to the first main surface 11. The first main surface 11 has a recess part 11a and a protrusion part 11b. The first main surface 11 of the wafer 10 can be referred to as a circuit-formed surface. The second main surface 12 of the wafer 10 can be referred to as a circuit-unformed surface.

The wafer 10 to which the present invention is applicable is typically a semiconductor wafer. Examples of the semiconductor wafer include not only a silicon wafer but also a germanium wafer, a gallium-arsenic wafer, a gallium-phosphorus wafer, and a gallium-arsenic-aluminum wafer. A thickness of the wafer is not particularly limited, and typically 600 to 800 μm, and more typically 625 to 775 μm.

In the laminate 1 for device wafer processing illustrated in FIG. 4, the first main surface 11 of the wafer 10 temporarily is adhered to the support 3 via the temporary adhesive layer 2 on the support 3 as illustrated in FIG. 2. According to the inventive laminate 1 tor device wafer processing, the tips 23 of the plurality of the pillar structures 22 can fellow the surface of the first main surface 11 even when the wafer 10 is a highly stepped substrate having the recess part 11a and/or the protrusion part 11b on the first main surface 11, as illustrated in FIG. 2. Thus, the second main surface 12 of the wafer 10 can be temporarily adhered to the support 3 in a state substantially parallel to the support 3 as illustrated in FIG. 4. Therefore, the inventive laminate 1 for device wafer processing can exhibit excellent process applicability to the TSV formation and the wiring process on the wafer back surface.

Temporary Adhesion Method

The inventive temporary adhesion method is a method for temporarily adhering a wafer to a support via a temporary adhesive layer, the wafer having a first main surface including a circuit and a second main surface to be processed, the second main surface being located on an opposite side to the first main surface, wherein temporary adhesion between the first main surface of the wafer and the support is performed via the temporary adhesive layer including a dry adhesive fiber structure having a plurality of pillar structures.

The inventive temporary adhesion method can be performed by using, for example, the inventive temporary adhesive laminate described above.

As described above, the temporary adhesion between the first main surface of the wafer and the support via the temporary adhesive layer including the dry adhesive fiber structure having the plurality of the pillar structures can provide sufficiently strong temporary adhesion between the wafer and the support for prevention of separation of the wafer from the support during wafer processes, such as, for example, thinning process, electrode forming, metal wiring forming, and protective film forming on the second main surface. Meanwhile, this temporary adhesion allows the wafer to be easily removed from the support after the process without an expensive apparatus.

Furthermore, the temporary adhesive layer including the dry adhesive fiber structure having the plurality of the pillar structures can be reused for another temporary adhesion even after releasing the temporary adhesion once.

As described above, the inventive temporary adhesion method can achieve the sufficiently strong temporary adhesion between the wafer and the support, the easy removal of the wafer from the support, and the repeated temporary adhesion and removal. Therefore, the inventive temporary adhesion method can produce, for example, thin device wafers with high productivity and low cost.

For the temporary adhesion, the temporary adhesive layer and the wafer may be attached each other by using an attachment apparatus. In the attachment, the wafer and the temporary adhesive layer can be uniformly crimped (preferably at more than 0 to 5 MPa, further preferably 1 Pa to 1 MPa within a temperature region of preferably a room temperature to 100° C., more preferably a room temperature to 80° C. For example, this attachment can form a body including wafer to be processed (laminate substrate) in which the wafer temporarily adhered to the support via the temporary adhesive layer, that is the above-described laminate for device wafer processing. No heating treatment is required thereafter.

Examples of a wafer attachment apparatus include a commercially available wafer bonding apparatus, for example, EVG5201S and 850TB, manufactured by EVG Corporation, and XBC300 manufactured by SUSS Corporation.

Device Wafer Processing Method

In the inventive device wafer processing method, temporary adhesion between the first math surface of the wafer and the support by the inventive temporary adhesion method; and the second main surface of the wafer temporarily-adhered is processed.

With the inventive device wafer processing method, the temporary adhesion is performed by the inventive temporary adhesion method and then the second main surface of the wafer is processed. Thus, as described above, thin device wafers can be produced with high productivity and low cost, for example.

Furthermore, as described above, the temporary adhesive layer including the dry adhesive fiber structure having the plurality of the pillar structures can be reused for another temporary adhesion even after the temporary adhesion is released once. That is, with the present invention, after the second main surface of one wafer is processed and then the temporary adhesion with the temporary adhesive layer is released, the temporary adhesive layer can be repeatedly used for another temporary adhesion.

In the other temporary adhesion, a silicon wafer other than the processed wafer may be temporarily adhered as the support, or a substrate other than a silicon wafer may temporarily adheres. Specifically, the present invention can achieve: processing the second main surface of the wafer; releasing the temporary adhesion with the temporary adhesive layer; and then temporarily adhering the substrate other than the processed wafer to the support via the temporary adhesive layer with an attachment condition similar to the above. Examples of the support other than the silicon wafer include a metal substrate, a glass substrate, and a quartz substrate.

The support may have a panel shape of square or rectangle. The substrate temporarily-adhered on the support also has no limitation of silicon, glass, metal, resin, etc.

Next, specific examples of the inventive device wafer processing method will be described.

An example of the inventive device wafer processing method includes the following steps (a) to (d).

Step (a)

The step (a) is a step of temporarily adhering the wafer to the support via the temporary adhesive layer. The wafer has:

the first main surface including a circuit (circuit-formed surface; front surface); and the second main surface to be processed (circuit-unformed surface; back surface), the second main surface being located on an opposite side to this first main surface. That is, the step (a) is a step of temporarily adhering the first main surface of the wafer and the support by the inventive temporary adhesion method.

Step (b)

A subsequent step is the step (b) of grinding or polishing the second main surface (circuit-unformed surface) of the wafer temporarily-adhered to the support, that is a step of thinning the wafer by grinding the wafer back surface side of the laminate for device wafer processing obtained by the attachment. A method of grind-processing the second main surface of the wafer is not particularly limited, and a known grinding method is used. The grinding is preferably performed while cooling the wafer and a grinding wheel (such as diamond) by watering. Examples of a machine for grind-processing the second main surface of the wafer include DAG-810 (trade name), manufactured by DISCO Corporation. The second main surface of the wafer may be subjected to CMP polishing.

A thickness of the thinned wafer to be obtained by the inventive producing method is typically 5 to 300 μm, and more typically 10 to 100 μm.

Step (c)

A subsequent step is the step (c) of further processing the grinded second main surface of the body including the processed wafer, that is, the wafer thinned by the back-surface grinding. This step (c) includes various processes used for the wafer-level processes. Examples thereof include electrode formation, metal wiring formation, and protective film formation. More specific examples thereof include conventionally known processes such as sputtering a metal for forming electrode, etc., wet etching for etching the sputtered metal layer, applying a resist for a mask for forming the metal wiring formation, forming a pattern with light exposure and development, removing the resist, dry etching, forming a metal plating, etching silicon for TSV formation, and forming an oxide film on the silicon surface.

Step (d)

A subsequent step is a step of removing the wafer processed in the above steps from the support, that is, a step of removing the wafer from the support after variously processing the thinned wafer and before dicing. In other words, this step (d) is a step of releasing the temporary adhesion with the temporary adhesive layer.

This removing step is typically performed under a condition at a relatively low temperature from a room temperature to approximately 60° C. Examples of specific methods thereof include: a method in which one of the wafer or support of the laminate for device wafer processing is horizontally fixed and the other is lifted with a certain angle to the horizontal direction; a method in which a protective film is attached to the grinded surface of the grinded wafer, and the wafer and the protective film are removed from the support by a peeling method; and a method in which a part of the wafer is lifted and removed with tweezers. Any of these removing methods can be applied to the present invention. The method is of course not limited to the above.

Releasing (removing) the temporary adhesion with the temporary adhesive layer can yield the device wafer having the first main surface including the circuit and the processed second main surface being located on an opposite side to this first main surface.

In addition, in the inventive method for processing a device wafer, none of the support surface and the device wafer surface are necessarily washed after removing the device wafer from the support.

Other Steps

After the step (d), the temporary adhesive layer can be repeatedly used for another temporary adhesion. Examples of a target of the other temporary adhesion include a substrate other than the wafer. Specific examples thereof include using the temporary adhesion with the temporary adhesive layer to laminate another substrate, such as a glass substrate and a quartz substrate, on the processed wafer.

Alternatively, after the step (d), to process a wafer other than the processed wafer, a first main surface being located on an opposite side to a second main surface of the wafer to be further processed can be temporarily adhered to the support via the temporary adhesive layer.

Since requiring no washing after releasing the temporary adhesion, the temporary adhesive layer used in the present invention can be efficiently used repeatedly for another temporary adhesion.

Method for Producing Dry Adhesive Fiber Structure

An example of a method for producing the dry adhesive fiber structure of the temporary adhesive layer used in the present invention will be described. However, the method for producing the dry adhesive fiber structure of the temporary adhesive layer used in the present invention is not limited to the following methods.

FIRST EXAMPLE

The first example is a method in which the plurality of the pillar structures is transferred to the surface of the support of silicon, glass, etc.

Specifically, a cylindrical resin, that is the fine fiber can be formed by: forming a cylindrical mold on a Si substrate by dry etching; and pouring a resin material into the formed cylindrical mold, for example. The transferring of the cylindrical resin molded with the circular mold in the silicon is performed by contacting the wide tip of the dry adhesive fiber structure with a sheet substrate such as PET. The dry adhesive fiber structure can be provided by bonding the other tip of the dry adhesive fiber structure transferred onto the PET to the support; and then removing the sheet substrate such as the PET.

In this time, the other tip is bonded to the support by using, for example, a high melting-point solder. Alternatively, strong bending to the support can be achieved by: treating the support surface, such as silane coupling treatment, anodic oxidation, and chemical surface roughening; and transferring the fine, flexible pillar structure to the support surface with applying heat and pressure.

SECOND EXAMPLE

Another example of the methods for forming the dry adhesive fiber structure on the support surface composed of silicon, glass, etc. is injection molding that can form the thin film and the fine pillar structures all together.

Thereafter, the film material having the fine pillar structures is attached on the support to provide the composite of the support and the temporary adhesive layer formed on the support.

THIRD EXAMPLE

The structure having the pillar structures on the surface thereof can also be obtained by pouring a desired resin into a porous resin for mold-processing.

FOURTH EXAMPLE

The dry adhesive fiber structure having the plurality of the pillar structures can also be obtained by nanoimprinting method using a mold having micro-scaled or nano-scaled recesses and protrusions, as described in, for example, Non Patent Document 2.

The fine, flexible pillar structure having the wide tips, described above, may not be a structure having a wide structure on only one side of the pillar structure, but may be flexible pillar structures having the wide structures on both ends. In this case, the support is removed after thinning the attached device wafer, which naturally generates a surface to be removed and a surface not to be removed. In this case, the surface to be removed is set to have an adsorption strength of the entire dry adhesive fiber structure being smaller than an adsorption strength of the entire dry adhesive fiber structure of the surface not to be removed. Such a difference in the adsorption strength can be regulated as described above.

EXAMPLES

Hereinafter, the present invention will be specifically described by using Examples, but the present invention is not limited thereto.

Example 1

A temporary adhesion target was a silicon wafer with 200 mm in diameter (thickness: 725 μm, a wafer to be a device wafer) in which copper posts (electrode structure) with 10 μm in height and 40 μm in diameter were entirely formed on a first main surface, one main surface.

First, to contact pillar structures of a dry adhesive fiber structure with a region other than the electrode structure of the first main surface of the wafer to achieve temporary adhesion, prepared was a glass substrate support with 200 mm in diameter (thickness: 500 μm) on which a silane coupling material was entirely spin-coated.

For preparing the dry adhesive fiber structure to be formed on the support substrate, a photoresist film was formed on a surface of a silicon substrate having a thickness of 725 μm and a diameter of 300 mm, and a pattern to form cylindrical pore molds was formed in the silicon substrate via a mask with a usual method. By dry etching with the Bosch method and utilizing a resist pattern having a selectivity to silicon, cylindrical pores with 20 microns in diameter and 50 microns in depth were formed in the silicon. After removing the resist for the pore formation, in order to form a wide part of the dry adhesive fiber structure, a resist pattern was formed central positions of openings of the resist were coincided with centers of the pores in the silicon, and the opening had a diameter of 30 microns. Then, a silicone-modified polyimide resin was poured into the pores in the silicon and into the resist pattern at the openings with screen printing, and the silicon substrate was heated at 100° C. for 60 minutes. Thereafter, the resist pattern was removed, and then the silicone-modified polyimide resin was hard-baked at 190° C. for 4 hours to be cured.

Then, a PET film having a thickness of 100 μm and having a sticking layer or the surface was laminated on and then crimped with the wide part surface of the dry adhesive fiber structure formed on the silicon substrate to transfer the dry adhesive fiber structure onto the PET film. The transferred dry adhesive, fiber structure was observed with an SEM to demonstrate that the cylindrical part had a diameter of 20 μm and the regularly provided wide tip parts had a diameter of 30 μm and a height of 20 μm, as designed.

A density of the dry adhesive fiber structure (observed with a plane SEM with a magnification of 2000) in this time was approximately 300/mm$^2$.

The PET film having the plurality of the pillar structures was vacuum-laminated with aligning on the glass support substrate on which a silane coupling agent was applied. The vacuum laminate condition was a negative pressure of 80 Pa and a temperature of 110° C. The laminated support substrate was taken out into the air, and the PET film on the surface was removed to finally obtain a glass support substrate (laminate for temporary adhesion) with the temporary adhesive layer including the dry adhesive fiber structure.

On the surface on which the pillar structure of the laminate for temporary adhesion was formed, the silicon wafer, the temporary adhesion target, was attached in a wafer attachment apparatus under a condition of a pressure in a chamber of less than 10 Pa, a stage temperature of 70° C., and a load of 0.21 MPa for 60 seconds. The silicon wafer had a diameter of 200 mm (thickness: 725 μm) and the copper posts with 10 μm in height and 40 μm in diameter were entirely formed on the first main surface which is one main surface of the silicon wafer. In this time, the attachment was performed so that the tips of the plurality of the pillar structure of the temporary adhesive layer were contacted with the first main surface of the wafer. A laminate for device wafer processing was thus produced.

Should be noted that, the glass plate was used here as the support to visually check abnormality after the substrate adhesion, but a silicon substrate with no light-transparency, such as a wafer, can also be used.

As the attachment apparatus, a wafer bonding apparatus EVG520IS, manufactured by EVG Corporation, was used. The visual check after the attachment demonstrated no problem of attachment quality.

Then, a back surface (the second main surface being located on an opposite side to the first main surface) of the silicon wafer was grinded with a grinder (DAG810, manufactured by DISCO Corporation) by using a diamond grinding wheel. After the back surface was grinded until a final substrate thickness of 50 μm, presence/absence of abnormality such as cracking, removal, etc. was checked with an optical microscope (magnification of 100), and no abnormality was observed.

Furthermore, the processed body including the silicon wafer with the grinded back surface was introduced into a CVD apparatus, and an experiment of 2-μm SiO$_2$ film formation was performed to check presence/absence of appearance abnormality in this time. No appearance abnormality was generated even after forming a thick oxide film. The plasma CVD apparatus used here was PD270TSL (manufactured by Samco Inc.) with an output RF of 500 W, an inner pressure of 40 Pa, and a gas species of TEOS (tetraethyl orthosilicate): $O_2$=20 sccm: 680 sccm.

Finally, removability of the support substrate was evaluated. Specifically, a test was performed as follows. Onto the wafer side having been thinned until 50 μm of the device body including the processed wafer after the CVD resistance test, a dicing tape was attached by using a dicing frame. Then, this dicing tape surface was set onto an adsorption plate by vacuum adsorption. Thereafter, at a room temperature, one point of the glass was lifted with tweezers to remove the glass substrate. As a result, the glass substrate was capable of being removed without breaking the wafer with 50 nm in thickness.

By using a laminate for temporary adhesion after the removal, that is after releasing the temporary adhesion, temporary adhesion for another silicon wafer was performed (under a condition same as above) to produce another laminate for device wafer processing. No washing of the temporary adhesion layer was performed before the other temporary adhesion again. Then, this other laminate for device wafer processing was subjected to back-surface grinding, a CVD resistance test, and a removing test as above, but no abnormality nor cracking was observed.

As described above, Example 1 achieved the temporary adhesive strength sufficient for resisting the processes such as the back-surface grinding and the CVD, and in addition, the wafer can be easily removed from the support after processed. Furthermore, in Example 1, after releasing the temporary adhesion with the temporary adhesive layer, the temporary adhesive layer can be reused without washing.

Example 2

Next, investigated was application to the Chip First step of Fan-out Wafer level Packaging.

A temporary adhesion target was a device structure of a resin substrate (90 mm×90 mm, thickness: 500 microns) having a first main surface, one main surface, and a second main surface, the other surface. On the first main surface, bumps (electrode structure) having a diameter of 15 μm and a height of 15 μm and composed of a low melting-point metal were entirely formed. On the second main surface, aluminum pads with 10-micron square mere entirely formed. The first main surface and the second main surface were connected with an electrode penetrating the resin substrate.

Used as a support substrate to temporarily bond the resin substrate was a glass substrate having a size of 300 mm×100 mm and a thickness of 700 microns, manufactured by AGC Inc.

For preparing the dry adhesive fiber structure to be formed on the support substrate, a photoresist film was formed on a surface of a silicon substrate having a thickness of 725 μm and a diameter of 300 mm, and a pattern to form cylindrical pore molds was formed in the silicon substrate via a mask with a usual method. By dry etching with the Bosch method and utilizing a resist pattern having a selectivity to silicon, cylindrical pores with 20 microns in diameter and 50 microns in depth were formed in the silicon. After removing the resist for the pore formation, in order to form a wide part of the dry adhesive fiber structure, a resist pattern was formed again. Central positions of openings of the resist were coincided with centers of the pores in the silicon, and the opening had a diameter of 30 microns and a resist film had a thickness of 3 microns. Then, a fluororesin was poured into the pores in the silicon and into the resist pattern at the openings with screen printing, and the silicon substrate was heated at 100° C. for 60 minutes. Thereafter, the resist pattern was removed, and then the fluororesin was hard-baked at 150° C. for 1 hour to be cured.

Then, a PET film having a thickness of 100 μm and having a sticking layer on the surface thereof was laminated on and then crimped with the wide part surface of the dry adhesive fiber structure formed on the silicon substrate to transfer the dry adhesive fiber structure onto the PET film. The transferred dry adhesive fiber structure was observed with an SEM to demonstrate that the cylindrical part and the wide part had the designed diameters and heights, same as in Example 1. This procedure was repeated to finally transfer the dry adhesive fiber structure on the entire PET film with 300 mm×100 mm. A density of the dry adhesive fiber structure in this time was approximately $300/mm^2$.

Then, a silane coupling material was entirely slot-coated on a glass support substrate with 300 mm×100 mm, and dried. Thereafter, the PET film entirely having the pillar structure was vacuum-laminated with aligning on the glass support substrate on which a silane coupling agent was applied. The vacuum laminate condition was a negative pressure of 80 Pa and a temperature of 110° C. The laminated support substrate was taken out into the air, and the PET film on the surface was removed to finally obtain a glass support substrate (laminate for temporary adhesion) with the temporary adhesive layer including the dry adhesive fiber structure.

On the surface on which the pillar structure of the laminate for temporary adhesion was formed, a resin substrate being a device structure (90 mm×90 mm, thickness: 500 microns), which was a temporary adhesion target, was attached in a substrate attachment apparatus under a condition of a stage temperature of 70° C. and a load of 0.21 MPa for 60 seconds. The resin substrate has a first main surface, one main surface, and a second main surface, the other surface. On the first main surface, bumps (electrode structure) having a diameter of 15 μm and a height of 15 μm and composed of a low melting-point metal were entirely formed. On the second main surface, aluminum pads with 30-micron square were entirely formed. The first main surface and the second main surface were connected with an electrode penetrating the resin substrate. In this time, the attachment was performed so that the tips of the plurality of the pillar structures of the temporary adhesive layer were contacted with the first main surface of the wafer with avoiding the bump structure. On this glass support substrate having the temporary adhesive layer, total three resin substrates were mounted (completion of a laminate for device wafer processing).

Then, this laminate for device processing having the glass as the support was sealed with a mold material by using a compression apparatus. For the sealing, a film mold material SINR-DF5770, manufactured by Shin-Etsu Chemical Co., Ltd., was used. A film thickness on the device was 100 microns.

Then, the mold material was grinded with a grinder (DFG8020, manufactured by DISCO Corporation) by using a grind wheel. The grinding was performed until the aluminum pads on the second main surface were finally exposed. On the aluminum pad surface after the grinding, presence/absence of abnormality such as cracking, removal, etc. was checked with an optical microscope (magnification of 100), and no abnormality was observed.

Furthermore, on the plane with the exposed aluminum pads, a photosensitive film material with 50 microns in thickness, SINR-DF3170SP (manufactured by Shin-Etsu Chemical co., Ltd.) was laminated with a vacuum laminator in the same manner as of the mold film. The laminate condition was 100° C. at 80 Pa. To open the aluminum pad part on the first main surface, photolithography using a mask was performed with a usual method. The process condition was prebake at 100° C. for 300 seconds, i-line exposure at an exposure dose of 1100 mJ/cm², and post exposure bake at 130° C. for 300 seconds. Development was performed with PEGMEA to obtain an opening pattern with 20 microns in diameter on the aluminum pad.

After the series of process on the glass support, for cutting into the original three devices, the mold layer was finally cut with a dicing apparatus to be divided. The divided devices were capable of being easily removed from the temporary adhesive layer including the dry adhesive fiber structure.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A temporary adhesion method, the method comprising temporarily adhering a wafer to a support via a temporary adhesive layer, the wafer having a first main surface comprising a circuit and a second main surface to be processed, the second main surface being located on an opposite side to the first main surface, wherein a temporary adhesion between the first main surface of the wafer and the support is performed via the temporary adhesive layer comprising a dry adhesive fiber structure having a plurality of pillar structures each having a main part and a tip having an upper end on top of the main part in which the width of the tip is enlarged toward the end directed upward, wherein a ratio of cross sectional areas of the tip to the main part of each of the plurality of the pillar structures is 1:1 where the tip borders the main part and 2:1 at the top of the tip, wherein each of the plurality of the pillar structures has a height of 1 µm to 1 mm, has a bottom surface having a diameter of 10 nm to 100 µm, and the tip of each of the plurality of the pillar structures has a diameter of 20 nm to 200 µm, wherein the plurality of the pillar structures is formed at a density of 100/mm² or more and 5000/mm² or less, wherein a structure in which the plurality of the pillar structures is formed with a silicone-modified polyimide is used as the dry adhesive fiber structure, and wherein a structure with a capability of a repeated temporary adhesion is used as the temporary adhesive layer.

2. A device wafer processing method, wherein a temporary adhesion between the first main surface of the wafer and the support is performed by the temporary adhesion method according to claim 1; and the second main surface of the wafer temporarily adhered is processed.

3. The device wafer processing method according to claim 2, wherein a temporary adhesion with the temporary adhesive layer is released after processing the second main surface of the wafer; and subsequently the temporary adhesive layer is reused for another temporary adhesion.

4. The device wafer processing method according to claim 2, wherein a temporary adhesion with the temporary adhesive layer is released after processing the second main surface of the wafer; and subsequently a substrate differing from the wafer is temporarily adhered to the support via the temporary adhesive layer.

5. A laminate for temporary adhesion used for temporarily adhering a wafer to a support via a temporary adhesive layer, the laminate comprising:

the support; and the temporary adhesive layer formed on the support, wherein the temporary adhesive layer comprises a dry adhesive fiber structure having a plurality of pillar structures each having a main part and a tip having an upper end on top of the main part in which the width of the tip is enlarged toward the end directed upward, wherein a ratio of cross sectional areas of the tip to the main part of each of the plurality of the pillar structures is 1:1 where the tip borders the main part and 2:1 at the top of the tip, wherein each of the plurality of the pillar structures has a height of 1 µm to 1 mm, has a bottom surface having a diameter of 10 nm to 100 µm, and the tip of each of the plurality of the pillar structures has a diameter of 20 nm to 200 µm, wherein the plurality of the pillar structures is formed at a density of 100/mm² or more and 5000/mm² or less, wherein the plurality of the pillar structures is formed with a silicone-modified polyimide, and wherein the temporary adhesive layer has a capability of a repeated temporary adhesion.

6. The laminate for temporary adhesion according to claim 5, further comprising a guard ring formed on the support and surrounding the dry adhesive fiber structure.

7. A wafer processing laminate for device wafer processing, comprising:

the laminate for temporary adhesion according to claim 5; and a wafer having a first main surface having a circuit and a second main surface to be processed, the second main surface being located on an opposite side to the first main surface, and the first main surface temporarily adhered to the support via the temporary adhesive layer on the support.

* * * * *